US010713158B2

United States Patent
Neufeld et al.

(10) Patent No.: US 10,713,158 B2
(45) Date of Patent: Jul. 14, 2020

(54) NON-VOLATILE STORAGE SYSTEM WITH DYNAMIC ALLOCATION OF APPLICATIONS TO MEMORY BASED ON USAGE MONITORING

(71) Applicant: Western Digital Technologies, Inc., San Jose, CA (US)

(72) Inventors: Nadav Neufeld, Palo Alto, CA (US); Mei Yi Madeline Ng, Redwood City, CA (US); Enosh Levi, Kochav Yair (IL); Rotem Sela, Hod Hasharon (IL)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 16/021,231

(22) Filed: Jun. 28, 2018

(65) Prior Publication Data

US 2020/0004671 A1  Jan. 2, 2020

(51) Int. Cl.
*G06F 12/02* (2006.01)
*G06F 3/06* (2006.01)
*G11C 16/34* (2006.01)

(52) U.S. Cl.
CPC ........ *G06F 12/0246* (2013.01); *G06F 3/0616* (2013.01); *G06F 3/0653* (2013.01); *G06F 3/0655* (2013.01); *G06F 3/0679* (2013.01); *G11C 16/3495* (2013.01); *G06F 2212/7201* (2013.01); *G06F 2212/7211* (2013.01)

(58) Field of Classification Search
CPC .... G06F 3/0616; G06F 3/0653; G06F 3/0655; G06F 3/0679; G06F 12/0246; G06F 2212/7201; G06F 2212/7211
See application file for complete search history.

(56) References Cited

U.S. PATENT DOCUMENTS

| | | | |
|---|---|---|---|
| 5,345,413 A | 9/1994 | Fisher et al. | |
| 5,737,413 A | 4/1998 | Akiyama et al. | |
| 5,937,425 A | 8/1999 | Ban | |
| 6,400,634 B1 | 6/2002 | Liou et al. | |
| 6,567,334 B2 | 5/2003 | Yamagami et al. | |
| 6,754,771 B2 | 6/2004 | Vincent | |
| 8,040,744 B2 | 10/2011 | Gorobets et al. | |

(Continued)

OTHER PUBLICATIONS

U.S. Appl. No. 15/851,092, filed Dec. 21, 2017 by Gholamipour et al.

(Continued)

*Primary Examiner* — Aracelis Ruiz
(74) *Attorney, Agent, or Firm* — Vierra Magen Marcus LLP

(57) ABSTRACT

Technology is disclosed for dynamically assigning apps to non-volatile memory based on monitoring the apps' usage of memory resources. For a memory system having a high endurance section, such as binary (or single level cell, SLC) memory, and a lower endurance section, such as multi-level cell (MLC) memory, an app, including both the code for executing the app and the associated data payload, may initially be stored in the lower endurance section. The memory system monitors the activity of the app for high levels of activity and, if the app is being frequently written, the memory system notifies the host. In response, the host can request the memory system to move the app or just its associated payload to the high endurance section.

20 Claims, 13 Drawing Sheets

(56) References Cited

U.S. PATENT DOCUMENTS

| | | |
|---|---|---|
| 8,667,215 B2 | 3/2014 | Marotta et al. |
| 9,159,406 B2 | 10/2015 | Higashitani et al. |
| 2006/0282610 A1 | 12/2006 | Dariel et al. |
| 2008/0244203 A1 | 10/2008 | Gorobets et al. |
| 2009/0300269 A1* | 12/2009 | Radke .................. G06F 12/0246 711/103 |
| 2009/0327591 A1 | 12/2009 | Moshayedi |
| 2010/0122016 A1 | 5/2010 | Marotta et al. |
| 2010/0169541 A1* | 7/2010 | Freikorn ............. G06F 12/0246 711/103 |
| 2010/0174847 A1 | 7/2010 | Paley et al. |
| 2012/0191927 A1 | 7/2012 | Gorobets et al. |
| 2012/0254549 A1 | 10/2012 | Hutchison et al. |
| 2012/0297122 A1 | 11/2012 | Gorobets et al. |
| 2013/0046920 A1* | 2/2013 | Ryu ................... G06F 12/0246 711/103 |
| 2013/0173844 A1 | 7/2013 | Chen et al. |
| 2013/0275680 A1 | 10/2013 | Ikegaya |
| 2014/0108705 A1 | 4/2014 | Gorobets |
| 2014/0160842 A1 | 6/2014 | Takafuji et al. |
| 2014/0281158 A1 | 9/2014 | Ravimohan et al. |
| 2015/0058530 A1 | 2/2015 | Reddy et al. |
| 2015/0095546 A1* | 4/2015 | Bennett ............... G06F 12/0246 711/5 |
| 2016/0077966 A1 | 3/2016 | Stabrawa et al. |
| 2017/0075812 A1* | 3/2017 | Wu ..................... G06F 12/0246 |
| 2017/0285943 A1 | 10/2017 | Dalmatov |
| 2017/0344300 A1 | 11/2017 | Chang et al. |

OTHER PUBLICATIONS

International Search Report & The Written Opinion of the International Searching Authority dated May 24, 2019, International Application No. PCT/US2019/017395.

* cited by examiner

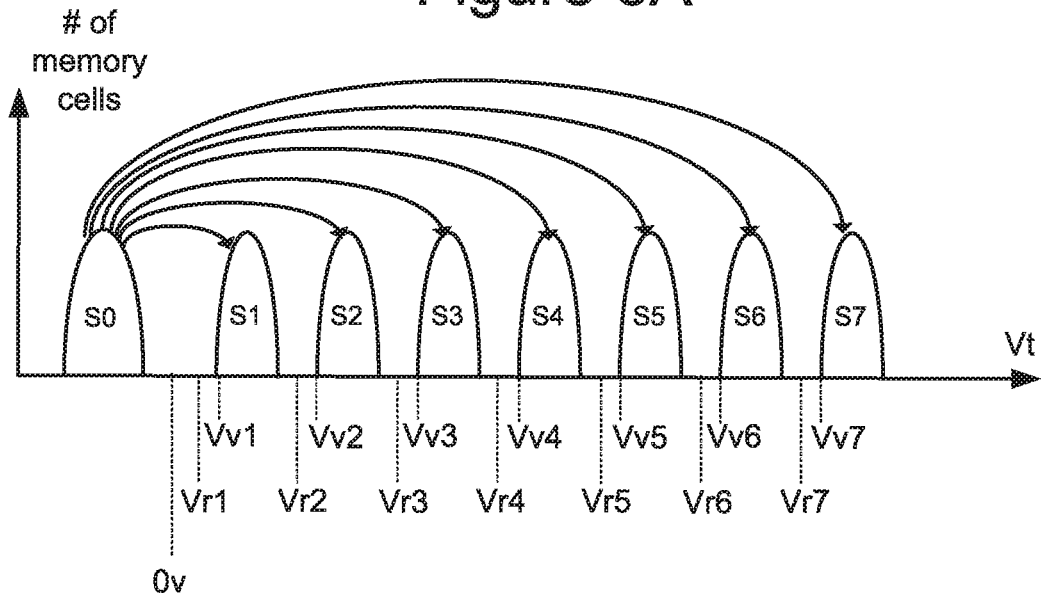
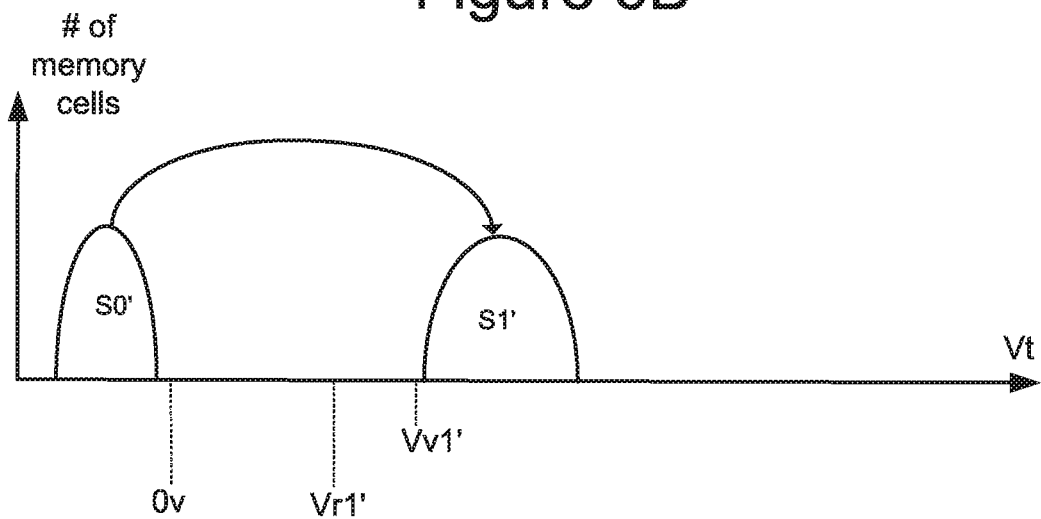

NON-VOLATILE STORAGE SYSTEM WITH DYNAMIC ALLOCATION OF APPLICATIONS TO MEMORY BASED ON USAGE MONITORING

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory, volatile memory or both. Non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

When a memory system is deployed in or connected to an electronic device (e.g., host), the memory system can be used to store (i.e., write) data and read data. The physical memory cells of a memory system have a limited lifetime, in terms of the number of program/erase cycles that they can undergo before they start to fail. Consequently, it can be important for a memory system to manage its write operations in order to optimize the memory system's lifetime.

BRIEF DESCRIPTION OF THE DRAWINGS

Like-numbered elements refer to common components in the different figures.

In some embodiments, the Front End Processor Circuit is part of a Controller.

Figure 3:
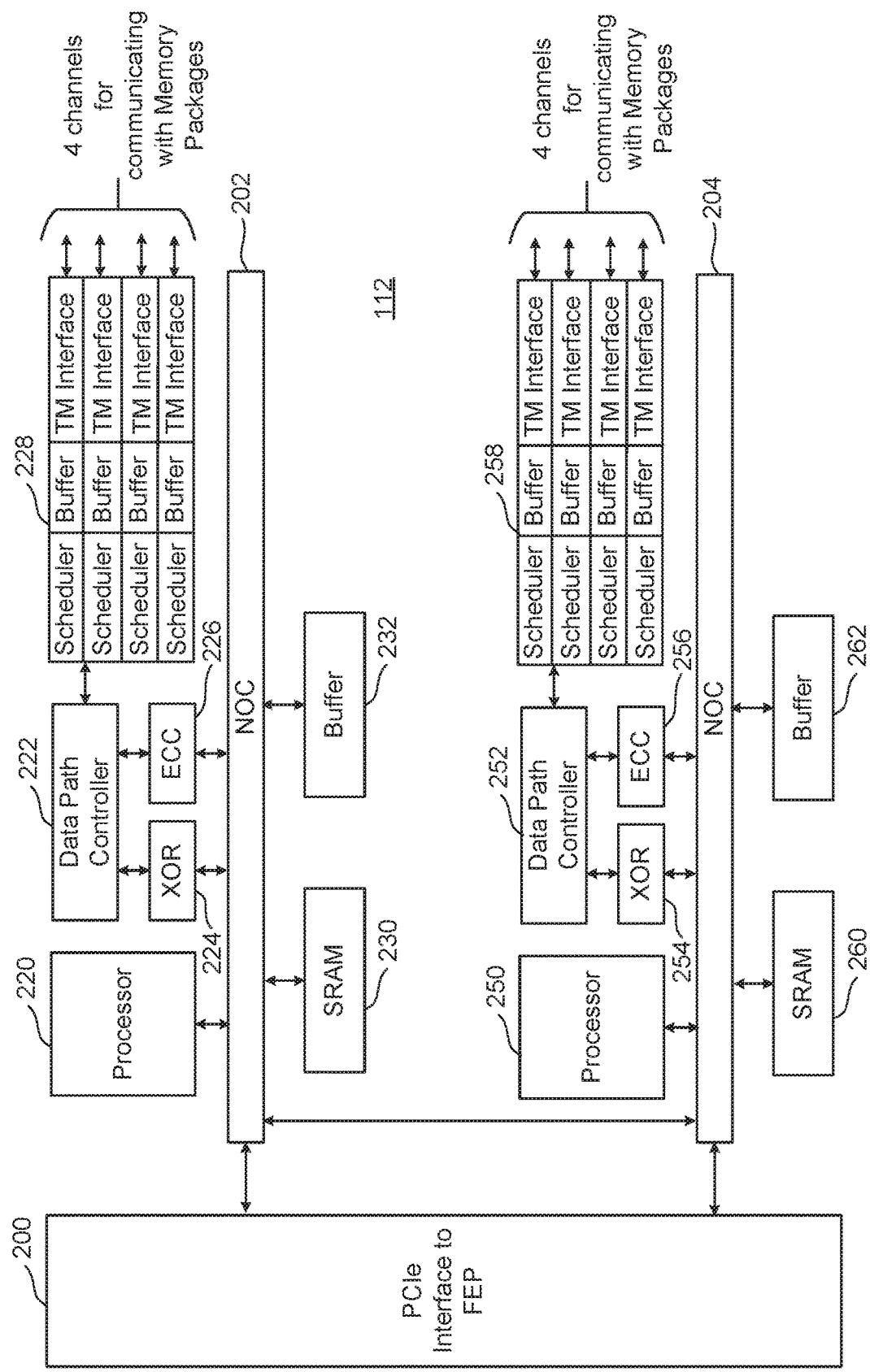

FIG. 3 is a block diagram of one embodiment of a Back End Processor Circuit.

In some embodiments, the Back End Processor Circuit is part of a Controller.

Figure 4:
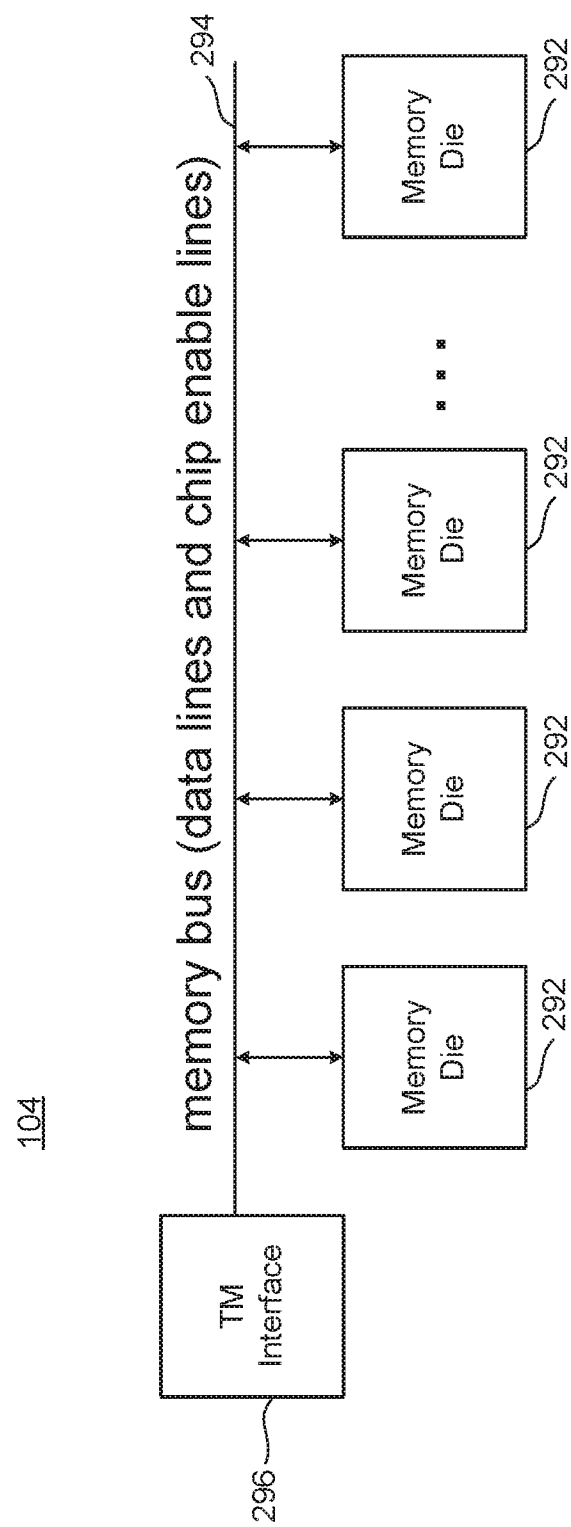

FIG. 4 is a block diagram of one embodiment of a memory package.

Figure 5:
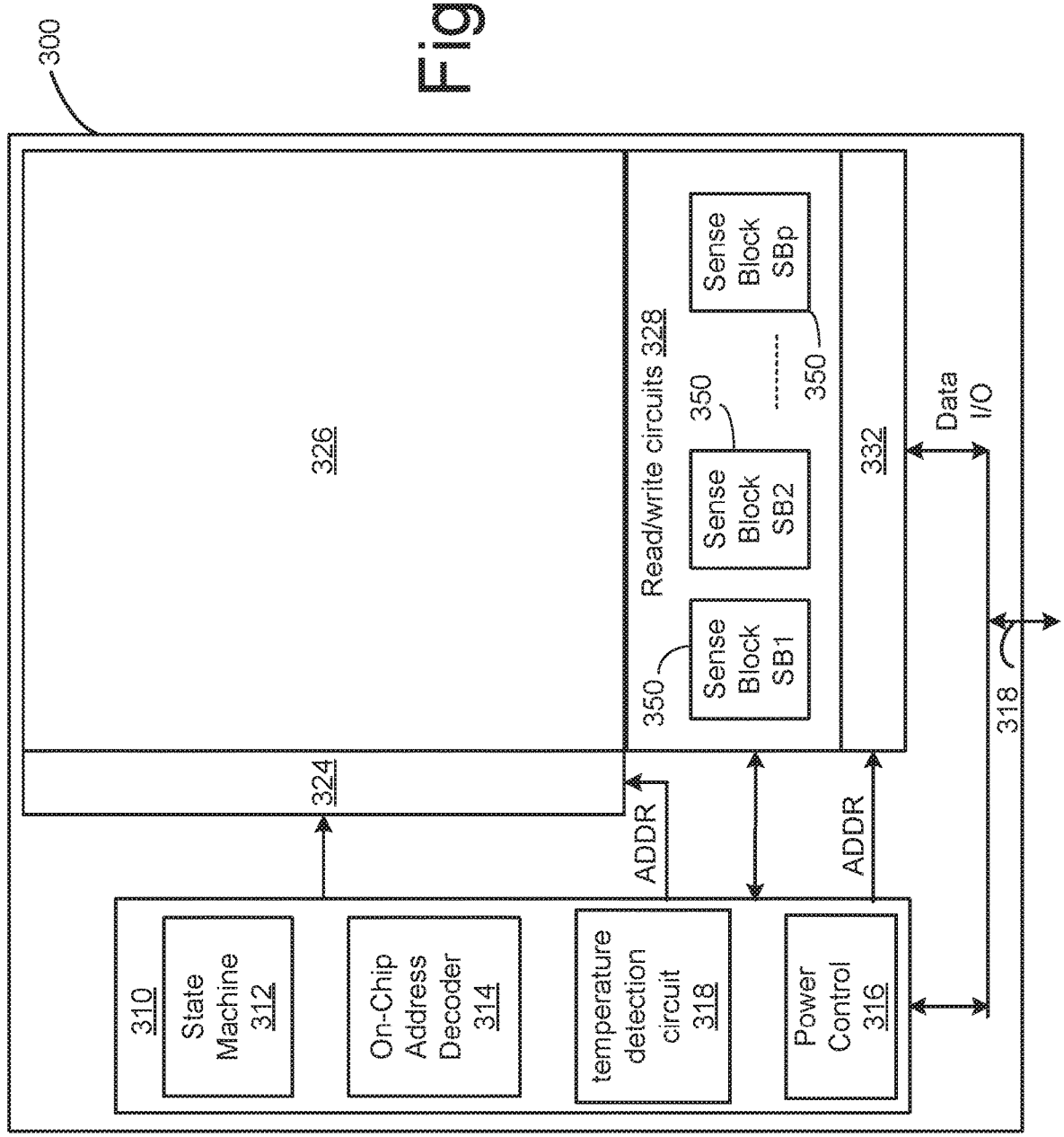

FIG. 5 is a block diagram of one embodiment of a memory die.

FIGS. 6A and 6B respectively depict threshold voltage distributions for multi-state memory cells and binary memory cells.

Figure 7:
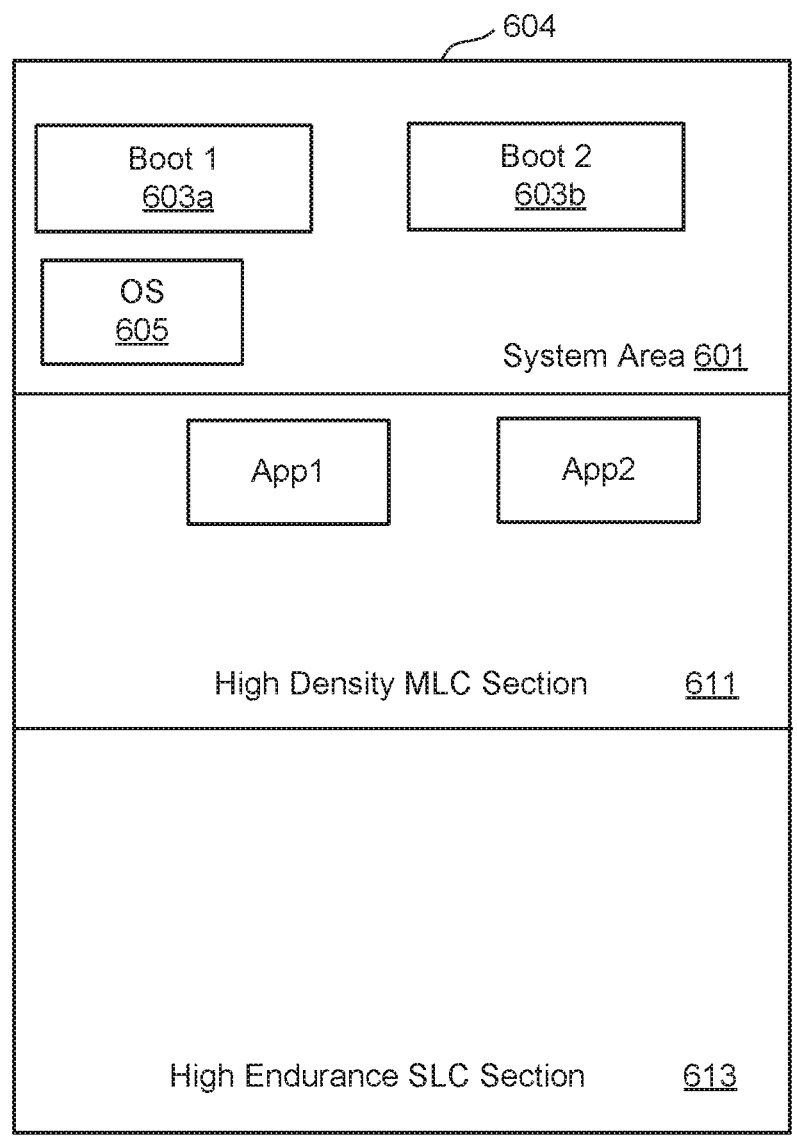

FIG. 7 illustrates one embodiment for a division of memory space into high endurance and lower endurance sections.

Figure 8:
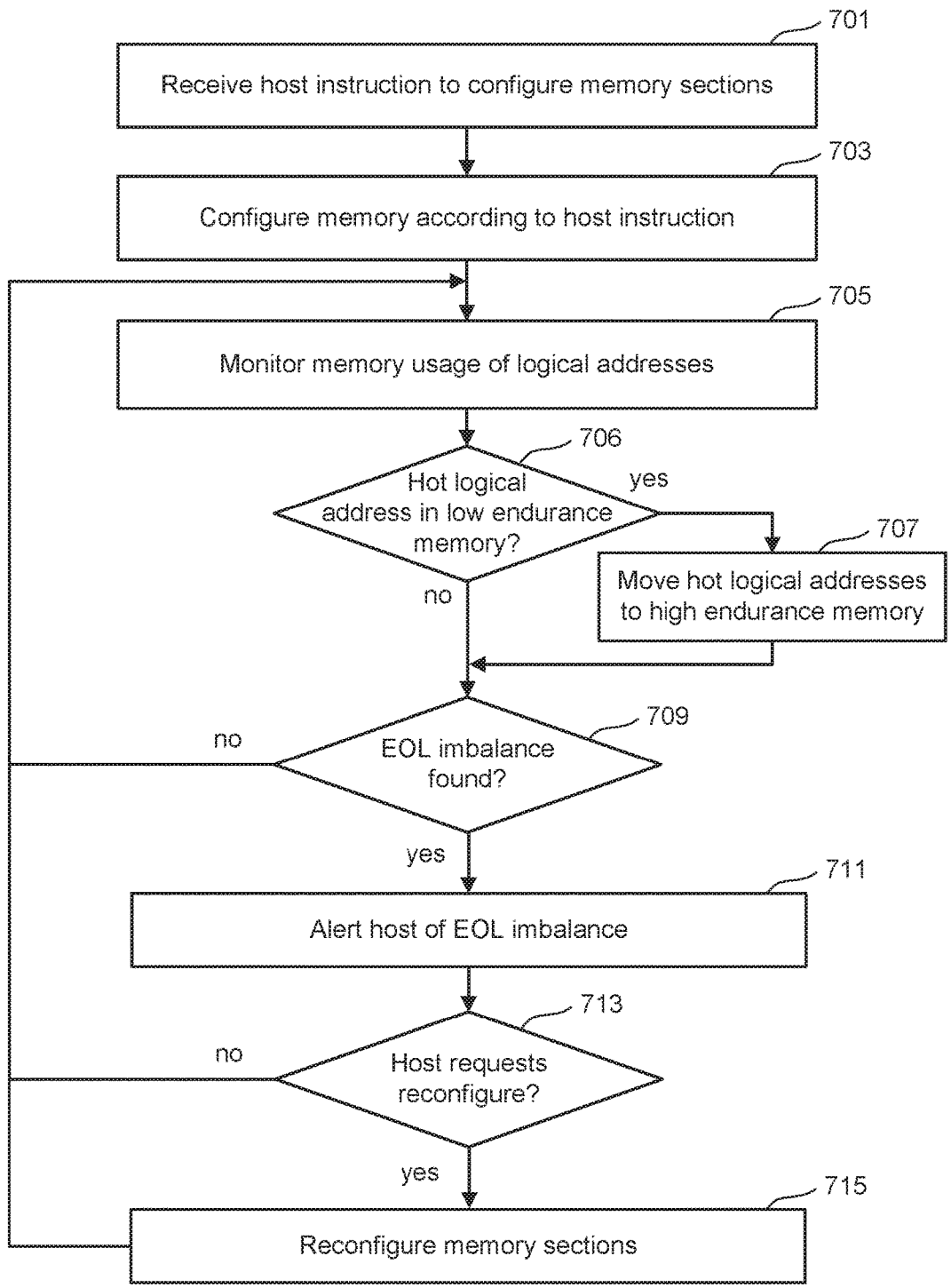

FIG. 8 is a flowchart describing one embodiment of a process for smart partition.

Figure 9:
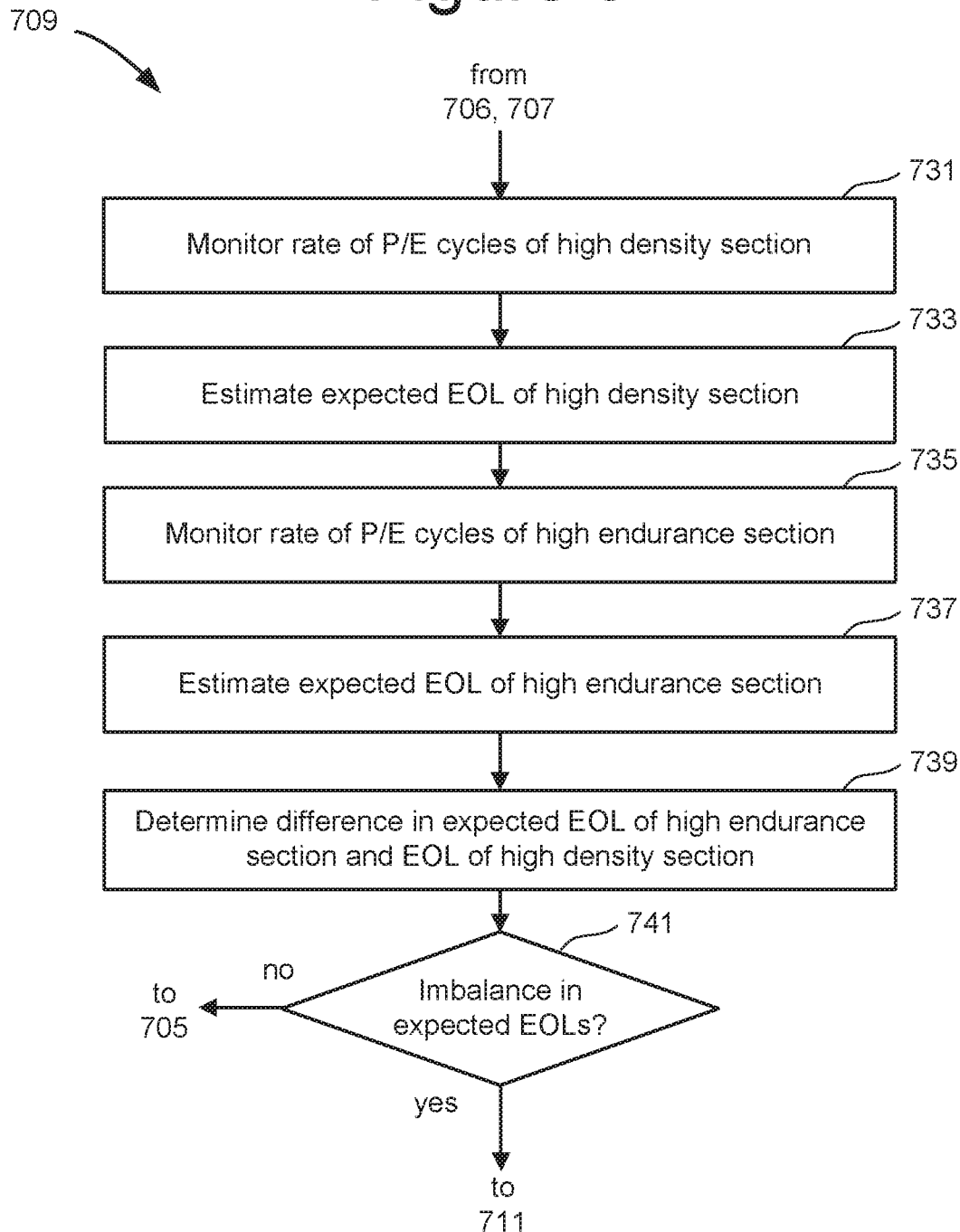

FIG. 9 is a flowchart expanding out a detail of FIG. 8 in one embodiment.

Figure 10:
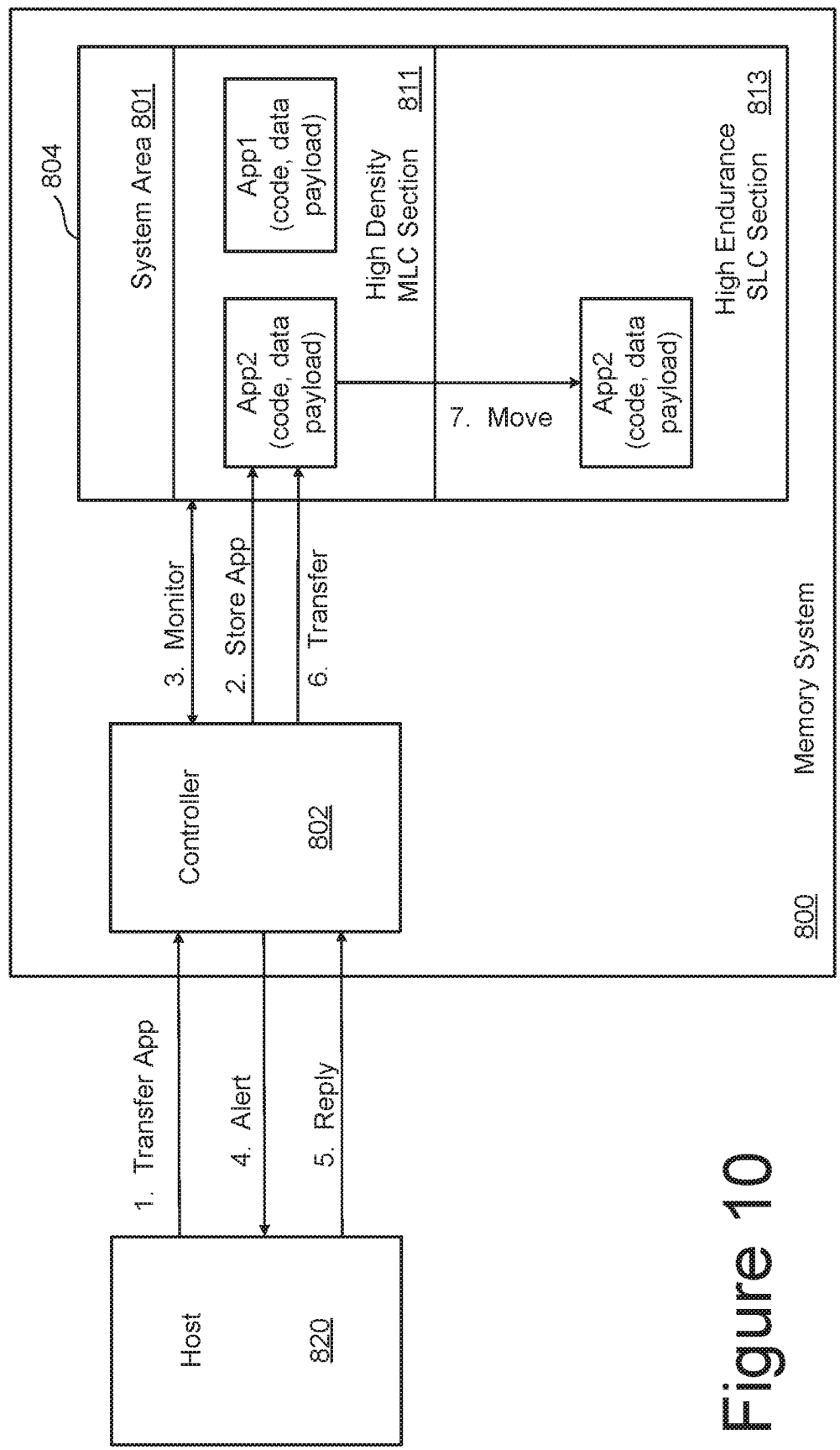

FIG. 10 schematically illustrates an embodiment for the dynamic allocation of applications to memory based on usage monitoring.

Figure 11:
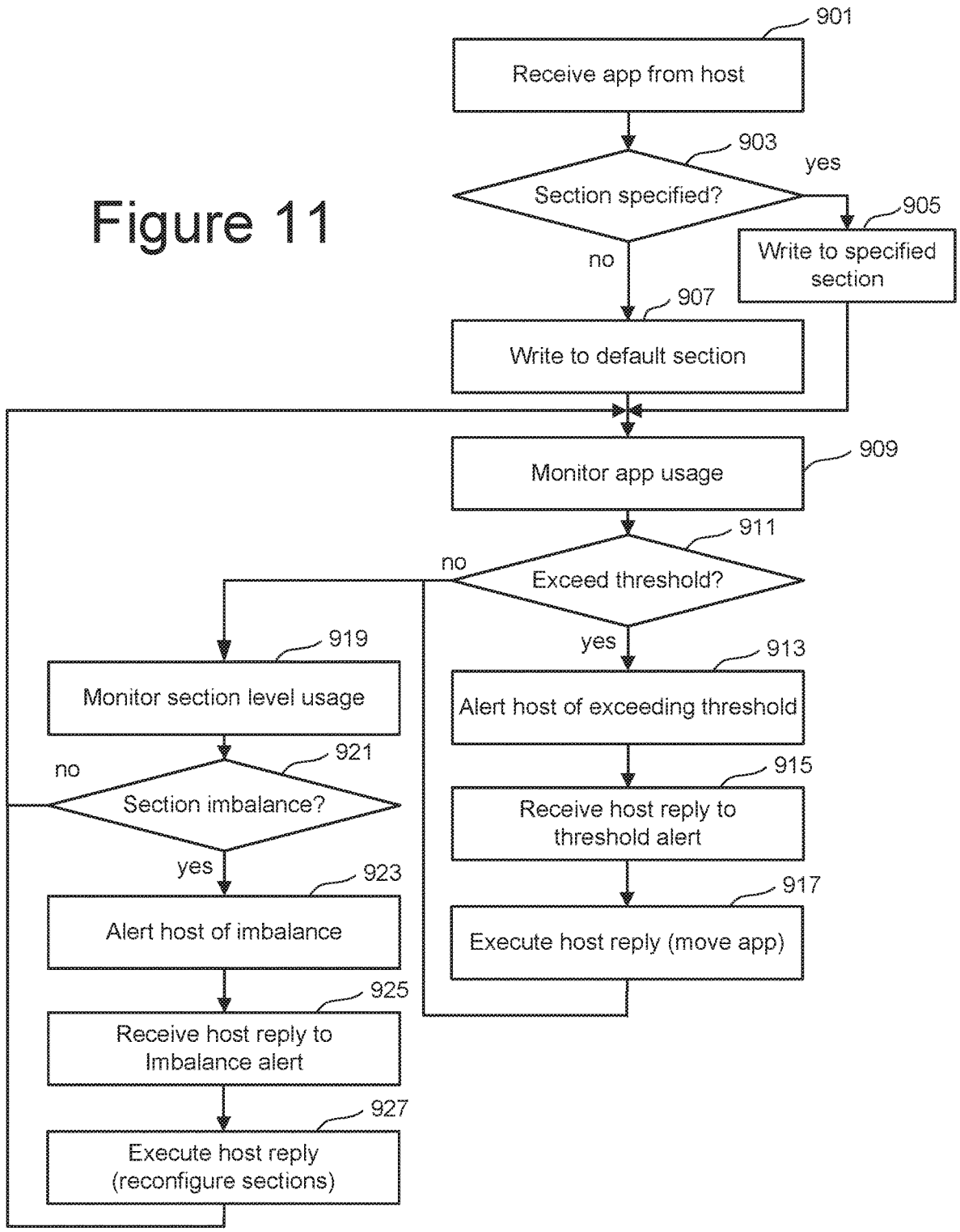

FIG. 11 is a flowchart describing one embodiment of a process for dynamic allocation of apps to memory based on usage monitoring as seen from the memory system side.

Figure 12:
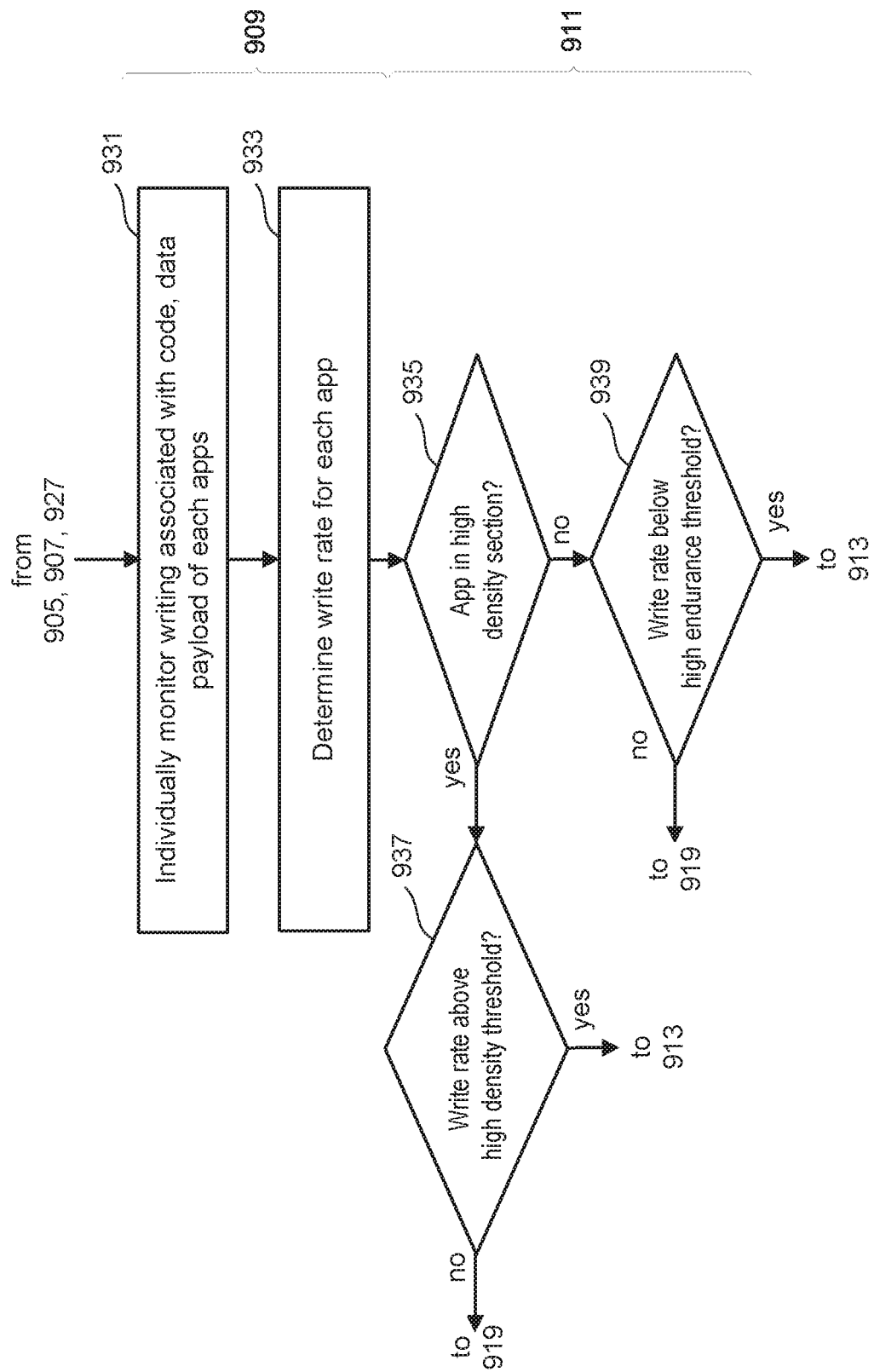

FIG. 12 is a flowchart expanding out a detail of FIG. 11 in one embodiment.

Figure 13:
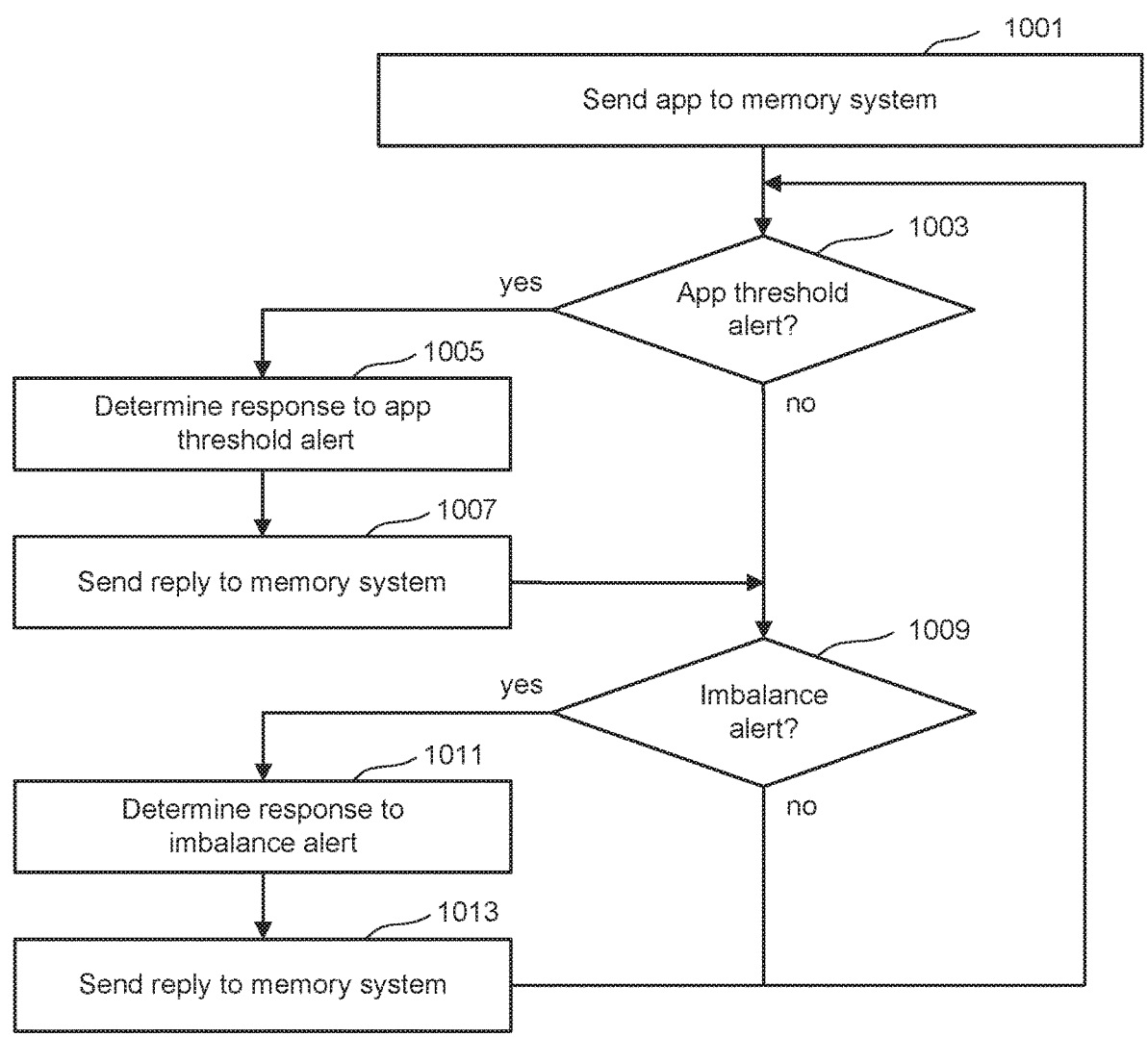

FIG. 13 is a flow chart describing one embodiment of a process for dynamic allocation of apps to memory based on usage monitoring as seen from the host side.

DETAILED DESCRIPTION

Non-volatile memory systems are often structured to include a high endurance section, such as formed of binary or single level cell (SLC) memory, and a high density, but lower endurance section formed of multi-level cell (MLC) memory. When a host stores an application, or "app", in the non-volatile memory, this will typically be stored in the high density section of the memory. If the host uses the app in a write intensive manner, such as frequently rewriting the data used by and associated with the app (or "data payload"), this can quickly wear out the high density section. It can be difficult to predict the usage of a particular app, since this can vary significantly between different users, or even for the same user at different times. Because of this, it can be difficult to determine in which of the memory sections the app should be kept.

The following discussion presents embodiments of non-volatile memory systems that monitor the rate at which an app generates data writes, where the app as a whole, both the associated code and the data payload associated with the app, are monitored. If an app stored in the high density, lower endurance memory section is being written heavily, the memory system alerts the host. In response, the host can request the memory system to move the app, either the data payload or the data payload and the associated code, to the higher endurance section of the non-volatile memory. Similarly, if an app in the high endurance section is relatively inactive, the host can also be informed and request that the app to be moved to the high density, lower endurance section. This dynamic allocation of applications to the different memory sections allows for efficient use of memory resources and extended memory life.

Figure 1:
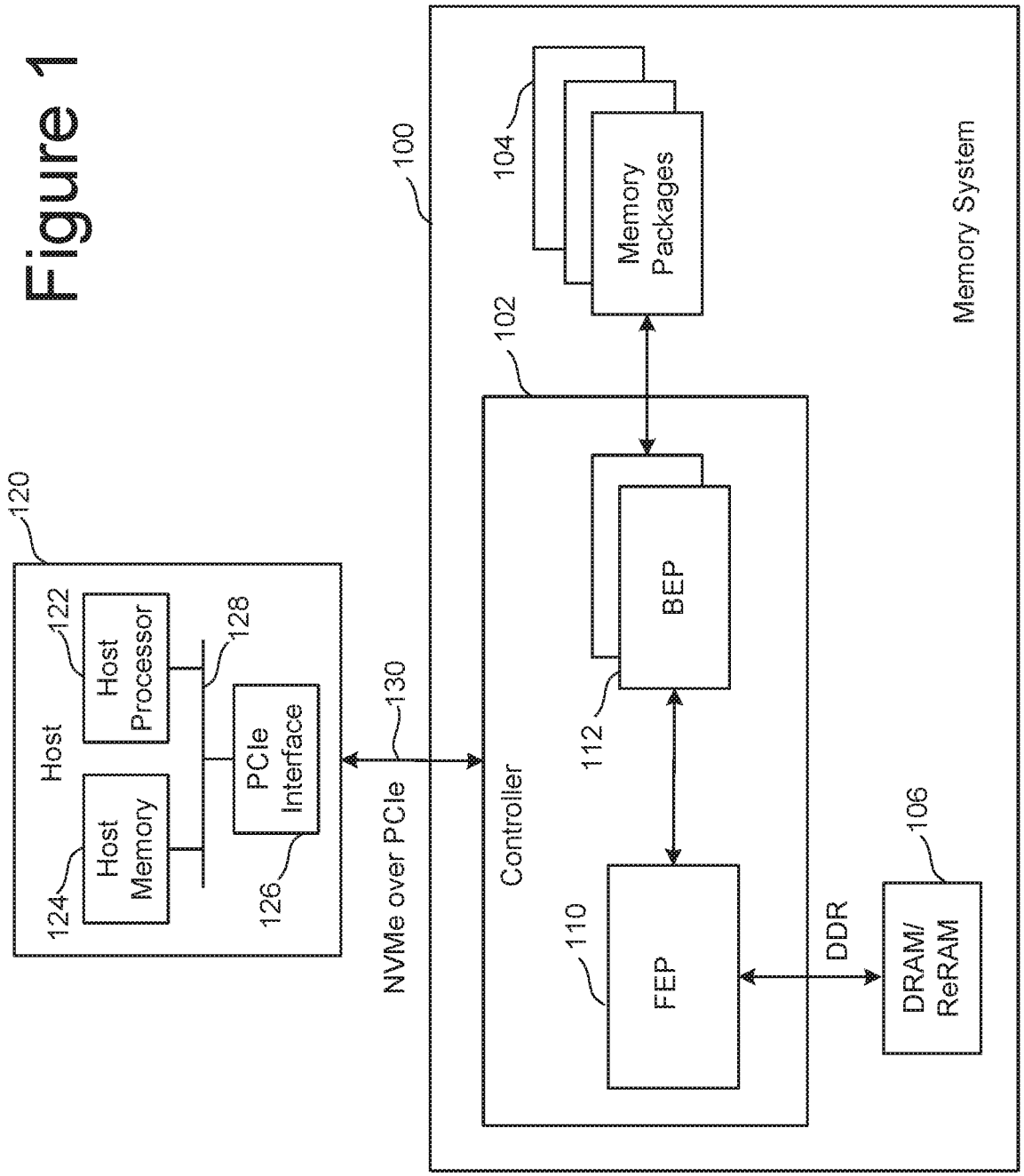
FIG. 1 is a block diagram of one embodiment of a memory system connected to a host.

FIG. 1 is a block diagram of one embodiment of a memory system 100 connected to a host 120. Memory system 100 can implement the technology proposed herein. Many different types of memory systems can be used with the technology proposed herein. Example memory systems include solid state drives ("SSDs"), memory cards and embedded memory devices; however, other types of memory systems can also be used. Memory system 100 comprises a Controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
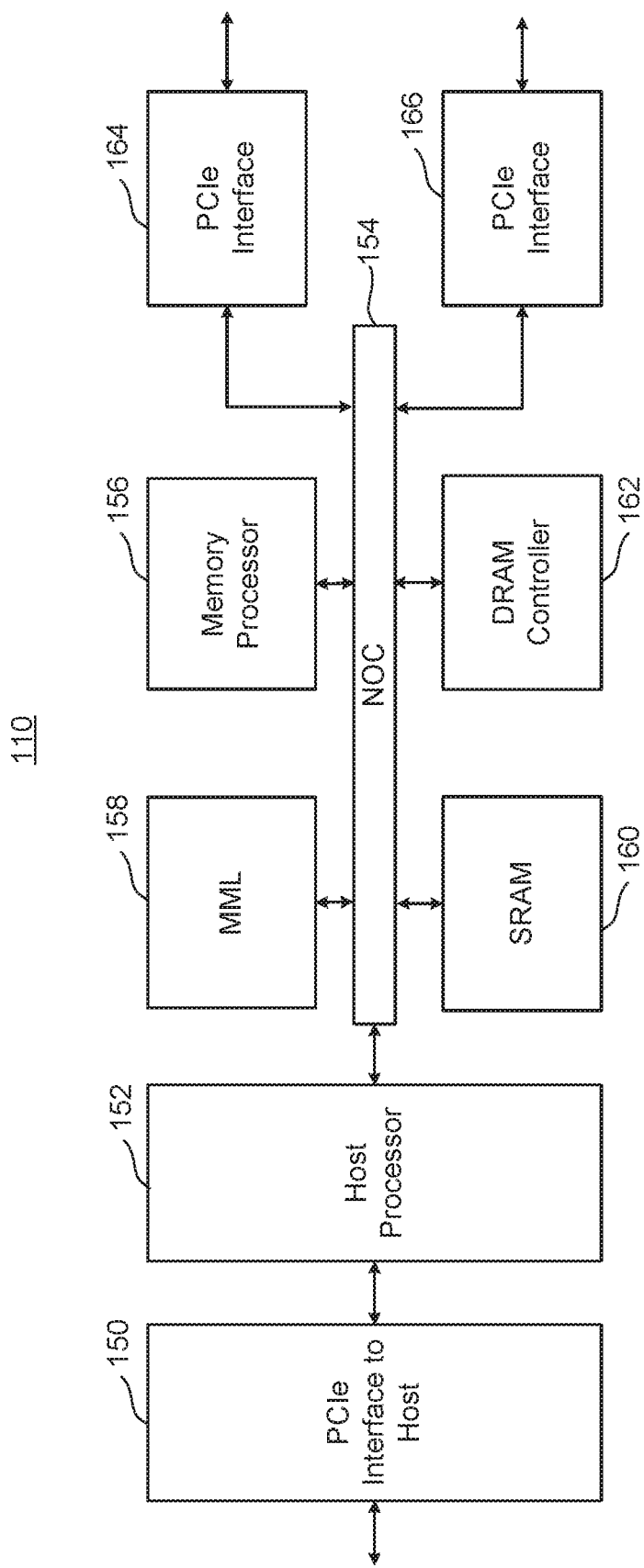
FIG. 2 is a block diagram of one embodiment of a Front End Processor Circuit.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC are two PCIe Interfaces 164 and 166. In the embodiment of FIG. 2, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML may be a module in the FEP circuit 110 and may be responsible for the internals of memory management. In particular, the MML 158 may include an algorithm in the memory device firmware which translates writes from the host into writes to the memory structure (e.g., 326 of FIG. 5 below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate the writes from host into writes into the memory structure.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 126 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the Controller and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters.

The on-chip address decoder 314 provides an address interface between addresses used by Controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" refers to a controller, a state machine, a micro-controller and/or control circuitry 310, or other analogous circuits that are used to control non-volatile memory.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

For the various technologies, the memory cells of a memory structure will typically have a limited lifetime. The stress of repeated reading, writing and erasing on a memory cell, particularly the writing and erasing, eventually wear out a memory cell. Consequently, a memory structure will often be considered reliable only up to some number of Program/Erase (P/E) cycles or other age metric, above which the amount of error may exceed the error correction capabilities of the memory system and the structure can no longer be considered reliable.

Memory structures can be made to have increased lifetimes, but this is often a trade-off with other considerations. For example, to increase storage densities, memory cells can store more data in each cell, using a multi-state or multi-level cell (MLC) format where each memory cell is configured to store 2, 3 or even more bits of data. The increased storage density of MLC memory typically comes at the cost of lower endurance and lower performance. Because of this, some memory systems will include a high endurance section and lower endurance section, where the lower endurance section can have another advantage, such as higher storage density. An example of this is where part of a memory system is configured to store data in a high density format, such as 3 or 4 bits per memory cell, while other portion is configured for high endurance, storing less bits per cell. Although the following discussion is more generally applicable, when reference is made to a particular example, the following will usually refer to an embodiment where a memory system has a high endurance section storing data in a binary or SLC format and a lower endurance section storing data in a multi-state or MLC format.

FIGS. 6A and 6B respectively illustrate memory cell distributions configured in an MLC and an SLC format in an embodiment where data states correspond to ranges of threshold voltages. The memory systems discussed above can be erased, programmed/written and read. At the end of a successful programming process, the threshold voltages of the memory cells should be within one or more distributions of threshold voltages for programmed memory cells or within a distribution of threshold voltages for erased memory cells, as appropriate. FIG. 6A illustrates example threshold voltage distributions for the memory cell array when each memory cell stores more than one bit of data in a multi-level cell (MLC) format, in this case three bits of data. Other embodiments, however, may use other data capacities per memory cell (e.g., such as one, two, four, or five bits of data per memory cell). FIG. 6A shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6A also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 6A also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6A represent the full sequence programming. The technology described herein can also be used with other types of programming in addition to full sequence programming (including, but not limited to, multiple stage/phase programming). In some embodiments, data states S1-S7 can overlap, with controller 102 relying on ECC to identify the correct data being stored.

FIG. 6B depicts example of threshold voltage when the memory cells store one bit of data per memory cell in a binary or single-level cell (SLC) format. FIG. 6B repeats the element of FIG. 6A, but when the memory cells now store only 1 bit of data, where the data states are the erased state S0' and a single programmed state S1'. The verify voltage for programming S1' is Vv1' and the read voltage for sensing S1' is Vr1'. The operation of memory cells in an SLC mode is largely as described above with respect to FIG. 6A for the MLC case, but where in a programming operation erased memory cells are either left in the S0' state or programmed to the only programmed state of S1'. As can be seen from comparing FIGS. 6A and 6B, the SLC distributions of FIG. 6B have a higher degree of separation than the MLC distributions of FIG. 6A. This allows for the SLC memory to be operated more gently as the margins between the states are greater, so that programming need not be as exacting and lower voltage levels and lower numbers of programming pulses can be used. For example, in the shown embodiment the memory cells of the S1' distribution of FIG. 6B only is only programmed to a verify level of Vv1', which about the same as Vv3 for the S3 state in FIG. 6A. This saves the SLC memory cells from being subjected to the high programming voltages used for the states S4-S7 in the MLC memory cells in FIG. 6A. Similarly, the SLC erase level used for S0' need not be as deep as MLC erase level used for S0. These features tend to provide make memory cells operated in an SLC format have a longer lifetime.

FIG. 7 illustrates one embodiment of a division of memory space 604 of the memory system into high endurance and lower endurance sections. The memory space also includes system data area 601, which includes data used by the memory system in its operation, such as the operating system OS 605 and the boot data Boot 1 603a for the system, along with a back-up copy of the boot data Boot 2 603b. Given the importance of such data for the operation of the memory system, this system data area 601 is configured as a high endurance SLC section.

The memory space 604 also includes a high density MLC section 611 and a high endurance SLC section 613 for storing user data. Although the MLC section 611 stores data with a higher density than SLC section 613, it will have lower performance as it takes longer to read and write data and has lower endurance. In a fairly typical example, the SLC section 613 may safely undergo ~50,000 P/E cycles, while MLC section 611 will have an endurance of ~5,000. The memory system can keep frequently accessed data, such as a File Access Table (FAT) of logical to physical address conversion data for the memory system, in SLC section 613. In some embodiments, the memory system may initially write user data into the SLC section 613, using it as a "binary cache" due to its higher write rate, and then subsequently transfer the user data into the high density MLC section 611. Although FIG. 7 represents each of the system data area 601, the high density MLC section 611, and the high endurance SLC section 613 as separated out into three distinct areas, in the memory structure of an actual die these may be interleaved across the physical memory structure.

Depending on the embodiment, the sort of subdivision illustrated for the memory space 604 can be spread across multiple memory die or individual memory die may be subdivided in this way. Referring back to FIG. 4, in some memory systems, such as an SSD with a large number of die, one or more of the memory die 292 may be an SLC specific die, used to more rapidly store data written to the memory system, while others of the memory die 292 are high density MLC memory die. In other memory systems, such as a memory card or embedded memory system with few die, the subdivision of FIG. 7 may correspond to a single memory structure of one die, such as memory structure 326 of FIG. 5. Much of the following discussion will mainly consider embodiments where the subdivision of memory space illustrated in FIG. 7 corresponds to a memory structure 326 of a single memory die 292, but it will be understood that in other embodiments the memory space may extend across multiple die.

The controller 102 of the memory system 100 can monitor the frequency with which logical addresses are accessed and if a particular logical address is rewritten frequently, this logical address can be kept in the high endurance SLC section 613. However, the situation becomes more complicated when it comes to storing user apps on the memory system. An app will include both the code for executing the app and also a payload of data associated with the app. Although any individual logical address associated with an app may not exceed a threshold for program/erase cycles, the application as whole may still cause a large number of writes to memory; and even if a particular logical address associated with an app exceeds a threshold for program/erase cycles, this could result in only that portion of the app being relocated, while the rest of the app is left in place. Consequently, some applications or use cases may write extensively to memory, and if these applications are kept in a low-endurance memory section, this will shorten the memory life of the product.

Many end devices that use a non-volatile memory, such as, but not limited to, mobile phones, tablets, Televisions (TVs), Set Top Boxes (STBs), smart watches, and so on offer an open apps environment (e.g. Android apps, iOS apps). The applications are often developed by various app developers and may make use of the device Flash or other non-volatile memory technology. Apps may vary significantly by the amount of data they write to a memory, varying both between apps and, for the same app, between different users. As an example, a video streaming app may use the embedded memory on an STB to buffer video, resulting in extensive write to memory. If extensive-write apps are writing to a low-endurance memory section, this will shorten the life of the memory and the STB with in which it is embedded.

Previous memory systems have addressed the problem of frequently written logical address regions, such as Logical Block Addresses (LBAs) for flash or other block structured memories, in various ways. For example, memory management layers commonly have load-balancing modules for balancing the number of P/E cycles across of physical memory regions, such as flash blocks. This method tries to ensure that all physical blocks are more or less leveled and no specific block is over-used. However, this approach looks at write frequency at the level of the block or other physical address region, not at the level of an app covering multiple such regions.

Another previous approach is for a host to configure a memory device with a static special (or "enhanced") physical partition or with a pre-defined static logical address (e.g., LBA) range. The memory device can then allocate blocks with enhanced endurance properties (e.g., SLC blocks or other high endurance memory) for these configured areas. In both cases (enhanced partition and pre-defined logical address range), the host is mapping the high endurance physical regions of the memory to a specific logical address or address range. However, the mapping may change according to use cases or may not be valid all the time. Hence statically mapping the address to a physical block has an inherent disadvantage. (In the following, reference is often made to LBAs, as logical block is a commonly used flash memory structure, but more generally, this can be taken just to represent a range of logical addresses.)

To improve memory efficiency and lifetime when storing apps, the following discussion presents techniques for dynamic allocation of apps to the memory based on usage monitoring and also techniques for a "smart partition" of memory space into a high endurance section and a high density section, where these are complementary techniques that can used together or independently. In dynamically allocating apps, the memory system individually monitors the usage of each of the apps, both the apps' associated code and data payload, as a whole. If a write intensive app is stored in a high density, low endurance memory section, or a relatively inactive app is stored in a high endurance memory section, the memory system can alert the host and, if requested by the host, move the app to a different memory section in response to the alert. In a smart partition, how the memory is partitioned into a high endurance section and a high density section can be changed by the host based on usage patterns.

Considering the use of a smart partition first, this looks at partition of the memory space into an enhanced, high endurance section and a lower endurance section. In this example, the high endurance section is SLC memory, the lower endurance section MLC memory, and logical address regions are identified by LBAs. The host initially configures the memory device with an amount X of high endurance memory, but does not map the blocks of this high endurance memory to a specific logical address range or to a specific physical partition of the memory device. While in use, the memory device can monitor memory usage to identify "hot" logical address regions, such as frequently written LBAs. Alternately, or additionally, the host can monitor usage to determine hot logical address regions and supply a list of these to the memory system. Based on this usage information, the memory system selects the map of hot LBAs to the high endurance memory section. Traditionally, the MML 158 of the controller 102 would map the LBAs to physical blocks according to load balancing techniques that operate on the same physical memory type, such as all SLC or all MLC. Here, the MML load balancing algorithm can mix the different physical memory types. This is achieved since in the initial configuring of the memory device, the host did not pre-configure (map) the physical blocks to the logical addresses based on usage assumptions. In some embodiments, as the memory device continues in operation, the controller and/or host can monitor usage to determine whether to reconfigure the memory device to change the amount of memory assigned to the high endurance section. For example, if the usage patterns suggest more high endurance memory is needed, some of the MLC memory section could be switched to SLC operation and added to the high endurance memory section.

FIG. 8 is a flowchart describing one embodiment of a process for smart partition. Starting at step 701, the memory system receives the instructions from the host on how to initially configure the memory device. For example, the host may have a particular set of default configurations based upon its expected use of the memory and what proportion of the memory should be assigned to be in the high endurance section. At 703, the controller performs the initial configuration of the memory according to the host instruction, assigning some amount of the memory space as high endurance, but these enhanced blocks are not mapped to a specific LBA range or specific physical partition (SLC or MLC).

After the initial partition, memory usage is monitored at step 705 to determine how frequently the logical addresses are written. The usage can be monitored by the controller, the host, or a combination of these. For example, the MML 158 on controller 102 can monitor the write rate of the individual LBAs and, based on this monitoring, at step 706 compare the write rate against a threshold value. If the write rate exceeds this value, at step 707, the controller selects these hot LBAs to map to the high endurance blocks of the memory. The load balancing algorithm of the controller's MML 158 can mix SLC and MLC blocks, rather than just perform load balancing within the individual physical block type. This is achieved since, in step 703, the host did not initially configure the memory to map physical blocks to logical addresses based on usage assumptions.

At step 709, memory usage is continued to be monitored to determine whether to reconfigure the memory, switching high density memory to high endurance memory, or the other way around. FIG. 9 looks at step 709 of FIG. 8 in more detail.

FIG. 9 is a flowchart expanding out step 709 of FIG. 8 in one embodiment. At step 731 the memory system monitors an aging factor, in this embodiment the rate of program/erase cycles, for the high density memory section 611. For example, this can be monitored by MML 158 on the controller 102. Based on this rate, an estimated End of Life (EOL) value can be determined at step 733. For example, if the high density memory section 611 has a capacity of 3 GB, has an expected remaining endurance of 5,000 P/E cycles, and is being written at 3 GB per day, the expected EOL is 5,000 days.

At step 735, the memory monitors the rate of P/E cycles (or other aging factor) for the high endurance memory section 613, estimating an expected EOL for the high endurance memory section 613 at step 737. For example, if the high endurance memory section 613 has a capacity of 2 GB, has an expected remaining endurance of 50,000 P/E cycles, and is being written at the rate of 100 GB per day, the expected EOL is 1,000 days for the high endurance memory section 613.

At step 739, the EOLs of the two sections are compared. For the example given above, the EOL of the high density memory section 611 is 5 times the EOL of the high endurance memory section 613. If this difference in EOL values is above some threshold level, say a ratio of 2:1 or other value in either direction, an imbalance is determined at step 741. If the difference is below the threshold, flow loops back to step 705. If the difference is above the threshold, the imbalance is reported out to the host at step 711.

Returning to FIG. 8, at step 711 the host is alerted to the EOL imbalance. If either the SLC section 613 or the MLC section 611 is aging relatively rapidly, the host may decide to reconfigure the memory. Continuing with the above example, the high endurance SLC section 613 is being heavily written and the host may decide to transfer some of the MLC section 611 to the high endurance SLC section 613, subsequently operating memory cells of the transferred portion in SLC mode. The host may also have additional information, such as information indicating that high usage rate of the high endurance section 613 is temporary and decide not to reconfigure at this time. If the host decides to reconfigure the memory at step 713, the host's reply to the memory system requests such a reconfiguration, which is executed at step 715 before looping back to step 705. If the memory is not to be reconfigured, the flow loops back from step 713 to step 705 for continued operation without reconfiguring the memory.

The smart partition approach illustrated by the flow of FIG. 8 can extend life of the memory device. By dynamically mapping the most extensively used physical addresses to the appropriate physical block type, the overall lifetime of the memory can be extended, and the risk of a "rouge app", which would heavily write to a particular set of logical addresses, destroying the memory can be significantly reduced. In addition to dynamically mapping the most extensively used physical addresses to the appropriate physical memory section, memory lifetime can also be extended by dynamic allocations of apps (both the code and associated data payload) to an appropriate physical memory section based on usage monitoring, as is now described.

More specifically, a mechanism is introduced for the memory system to identify apps that are generating high amounts of data writes and triggers an alert to the host. The host in turn uses this information to determine whether to move the app to a high-endurance partition of the memory. Depending on the embodiment, both the app's code and data payload can be moved or just the data payload. Allowing the host to make this decision lets the host make the determination based not only on usage information from the memory system, but also other information that the host may have available. Even if the host has some initial idea of the appropriate memory section for storing a particular app, usage may change over time and also vary greatly between different users of the same app. For example, a video streaming application on a set top box (STB) host might begin to experience a high amount of data writes due to video buffering. However, the STB may be aware that this traffic is due to, say, a particular sporting event and that a high write rate associated with the app will only be of a limited duration and, consequently, determines not to move the app into high endurance memory. If the host does decide to move the app, the memory system is informed, and the app is moved to the high endurance memory section. Under this mechanism, the memory system monitors the memory usage of the app as an entity, not just particular logical addresses that may be associated with the app, and then moves the app as a whole, either both code and data payload or just the data payload, to the newly assigned memory section. Alternate embodiments may also allow for the memory system to additionally or alternately make some of the move decisions independently of the host.

Conventionally, one approach to storing apps in memory is for the host to predict the overall app memory consumption and, based on the predication, place the app on an appropriate memory section. More commonly, all applications are placed into one memory partition. Once stored on the memory device, the apps are not moved between partitions based on actual write patterns. Even though a host may have some estimate of an app's likely usage, app usage can vary significantly between users and, even for the same user, over time. Users may install different apps and may use them differently. For example, two different users might install a video streaming app, with one user streaming content a few hours per day while the other user may only occasionally watch a clip or two a week. Consequently, the optimal partition for an app may vary both across users and over time.

To be able to more accurately store an app in the appropriate memory section, the following discussion describes methods in which the memory device is aware of the logical addresses that correspond to different apps (for example, based on a "context ID" field of an application programming interface) and can identify apps that write extensively to memory. When a certain threshold is reached (e.g., more than 30 GB of data written by an app over a period of 1 day), the memory system can alert the host. The host in turn can decide to move the application to a higher endurance memory partition and notify the memory system to perform the move. In the same way, the host may decide to move an application that has not been writing large amount of data to memory (no alert received, say, during the past week), from a high endurance section to a low endurance section.

FIG. 10 schematically illustrates an embodiment for the dynamic allocation of apps to memory based on usage monitoring. In FIG. 10, a host 820 is connected to memory system 800, which could be an embedded memory, an SSD, or memory card, for example. The memory system 800 includes a controller 802 and one or more memory die, one of which is shown at 804. The elements can be as described above with respect to the memory system of FIGS. 1-5.

The memory die 804 is configured as described above with respect to FIG. 7, having a high endurance system data area 601; a lower endurance, high density user data section 611; and a high endurance user data section 613. In the embodiment illustrated in FIG. 10, each of these three areas are included on a single die, but in other embodiments these may be spread across multiple die: for example, in an SSD embodiment, one or more die could be SLC specific die, while others of the die could be high density MLC die.

Considering one specific embedded memory embodiment further, the memory die 804 could, for example, have a capacity of 8 GB. An SLC system data area 801 for storing the operating system, copies of the boot block, and other system data can be allotted 0.5 MB. The high density MLC section 811 can be allotted 3 GB and has endurance of ~5,000 P/E cycles and would be the default area where apps and other used data is stored. The remainder of the memory space is allocated to the high endurance SLC section 813, which is used to store write intensive apps and other user data and has an endurance of ~50,000 P/E cycles.

The process begins with one or more applications being transferred from the host 820 to the memory system 800, where they are received by the controller 802. Each of the apps will correspond to a range of logical addresses, such as a specified set of multiple LBAs, that will cover both the code and the data payload of the data associated with a given app, that are identified as corresponding to a given app. In some embodiments, the host can specify the memory section where the app should be written. In other embodiments, or if the host does not specific, the app will be written to the default area for apps and other user data, typically the high density, low endurance MLC section 811.

The controller 802 then writes the received apps in either the default or specified section of the memory space. In this example, all apps and app payload reside in the MLC section 811 by default. App1 represent a group of apps that make little use of flash memory, and App2 represent a group of write-intensive apps. The memory device monitors the apps, and thereby tracks each apps' write intensity. The monitoring can be for the app as a whole, not just individually LBAs associated with the app, in order to better track an apps activity. In some embodiments, the controller 802 can also monitor individual LBAs to track both the app as a whole and also individual logical addresses associated with the app.

The controller 802 can alert the host the host 820 if an app, such as App2, is being written intensely. For example, if the App2 write group is averaging more than 30 GB per day, the host 820 will be alerted. Depending on the embodiment, the threshold for alerting the host can be a fixed value or adjustable. The threshold values can also vary with time to reflect device aging or a reconfiguration of the memory space assigning different proportions of the memory space to be high endurance section. In this example, the memory controller 802 is alerting the host 820 of a high write level for App2 in the lower endurance section 811, but in other embodiments the controller can also monitor for apps in the high endurance section 813 that are not being frequently written, so that the host can decide to move these low activity apps into the high density section 811. In some embodiments, the controller 802 can also make decisions to move an app itself, such as if a second, higher threshold has been reached or if the host 820 has previously instructed the controller 802.

The host 820 then determines whether the high write intensity app should be moved to a different memory section. This decision can be based just on the write rate associated with the app, or also based on other information that the host 820 may have. For example, the host may know that a particular app may undergo intense use, but only for a limited time. This could be the case for, say, a video streaming app that is heavily used for a particular sporting event that last only for a limited time, in which can the host 820 may decide not to relocate the app. If, however, an app continues to use the low endurance memory at a high usage rate, this can rapidly cause the memory system 800 to reach end of life relatively quickly. If the host 820 decides to move the high write intensity app, the controller is informed, which then causes the app (App2) to be relocated to the high endurance SLC section 813. By leveraging the alert mechanism and transferring App2 to the SLC section 813, the memory system 800 can significantly extent its lifetime.

Depending on the embodiment, the code and data payload of the App2 can be moved, or just the data payload, as the payload will typically be the source of the large number of writes.

Some apps will use or interact with other associated apps, such that one heavily used app will also result in another app generating a large number of write operations. For example, say App1 is a mapping app and App2 frequently uses location data requested from App1, App2 may cause App1 to have a high write rate. In these circumstances, it would also make sense to move App1, or at least the associated data it generates due to App2 to the SLC write-intensive section 813. The host 820 may be aware of, or determine, the relation of the two apps and make the decision to transfer associated apps together between memory areas. Alternately, or additionally, the controller 802 may determine the relationship or be alerted to it by the host.

FIGS. 11 and 13 are flow charts describing embodiments of a process for dynamic allocation of apps to memory based on usage monitoring as seen from the memory system side and the host side, respectively. Beginning at step 901 in FIG. 11, the controller 802 on memory system 800 receives an app from the host 820 to store on the memory device 804. For embodiments where the host has the option of specifying a memory section, at step 903 the controller 802 checks to see whether the host has specified which memory section the app should be stored in, where, for example, the host can base this decision on typical usage patterns for the app. If the host has specified a particular memory section, at step 905 the app is written to either the high density MLC section 811 or high endurance SLC section 813 as indicated by the host. If, as is typical, the host has not specified a particular memory section at step 903 (or for embodiments where this is not an option), then at step 907, the app is written into the default memory section, where this is typically the high density MLC section 811.

At step 909 the memory system monitors app usage and at step 911 determines if the usage rate of any of the apps exceeds a threshold. FIG. 12 provides additional detail for steps 909 and 911.

FIG. 12 is a flowchart describing one embodiments of a process for steps 909 and 911 of FIG. 11. Step 909 corresponds to steps 931 and 933 in FIG. 12. Once the app is written into the memory device 804, the controller monitors its usage at step 931. For each app, the controller 802 is aware of the logically addresses, such as a range of LBAs, corresponding to app, both its code and data payload. The controller monitors the app as a whole to determine its write rate at 933. For an app in the lower endurance, high density MLC section 811, the app is monitored for intensive write activity. Apps in the high endurance SLC section 813 can also be monitored for relatively lower levels of activity, indicating that they may not warrant being located in a high endurance section. In a memory system that also monitors an individual LBA's activity, the presence of a particularly hot LBA associated with an otherwise not particularly active app can also be monitored as a basis for host alerts.

At step 911, the controller 802 determines whether the usage of a monitored app has exceeded a threshold, where this corresponds to steps 935, 937 and 939 of FIG. 12. At step 935, it is determined whether the app is in the high density memory section 811 (Yes path) or in the high endurance section 813 (No path). For determination of intense write activity at step 937, this can be for a certain amount of data writes over a particular time period, such as, for example, more than 30 GB of data written by an app over a period of 1 day. For a determination of a relative inactive app at step 939, this could be, for example, no or only a small amount of writing over a period of a week. The thresholds may be fixed or adjustable based on factors such as the number of apps undergoing intense write activity, aging of the device, reconfiguration of the relative amount of the memory space that is high endurance, or other factors. If no thresholds are exceeded, the flow goes to step 919, eventually looping back to step 909 to continue usage monitoring.

Referring again to FIG. 11, if usage is determined to exceed a threshold at step 911, the controller 802 notifies the host 820 at step 913. A reply from the host 820 is received at the controller 802 at step 915, where the host can request the app to be moved or to be left where it is currently. The host may request both the app's associated code and data payload to be moved, or just the data payload to be moved, leaving the code in place. If a move is requested, at step 917 the app (its code and data payload or just data payload) are moved from one memory section to another, being transferred from MLC section 811 to SLC section 813 for apps with high write rates and/or from SLC section 813 to MLC section 811 for low activity apps. The host 820 may also request moves for one or more other apps that generate or may generate a high number of writes due to the initial app's (i.e., the one compared at step 911) heavy usage. The flow then goes to step 919.

In some embodiments, the flow can also include a smart partition monitoring process, similar to that described above with respect to FIGS. 8 and 9, to determine whether to reconfigure the partition of the memory device 804 into the high endurance SLC section 813 and high density MLC section 811. At step 919, the controller 802 monitors the relative section level usage of the different memory sections. In the flow of FIG. 11, this is included in the loop back to 909 from steps 911 and 917, but the monitoring at step 919 and (subsequent back and forth between the controller 802 and host 820) can be occurring concurrently with the monitoring of step 909.

At step 921, the relative wear levels of the sections are checked to see whether one of these areas is approaching its End Of Life (EOL) more rapidly than another. For example, even though the SLC section 813 has a higher endurance level than the MLC section 811, it may still be undergoing very intense write rates, so that it is nearing its EOL while the MLC section 811 is still relatively fresh. If the different memory sections are aging in a relatively balanced manner, such as the variation in their EOL values varying less than some threshold (No path), the flow continues back to 909. If, instead an imbalance is found (Yes path), the controller 802 informs the host 820 at step 923. The controller 802 receives the reply from host 820 at step 925 and, if a reconfiguration is requested, the controller 802 reconfigures the memory device 804 at step 927, transferring some of the memory cells of MLC section 811 to SLC section 813, or from SLC section 813 to MLC section 811, as requested by the host. After step 927 the flow then loops back to 909.

FIG. 13 is a flow chart describing one embodiments of a process for dynamic allocation of apps to memory based on usage monitoring as seen from the host side, corresponding to the flow chart of FIG. 11 for the memory system side. Starting at step 1001, the host 820 sends an app to the memory system 800, where it is received at step 901 on the memory device flow of FIG. 11.

At step 1003 the host 820 determines whether it has received a notification from the memory system 800, as sent by the controller 802 at step 913. If not, the flow continues on to 1009 and continues monitoring for alerts from the memory system 800. If the host 820 has received an alert form the controller at step 1003, based on the alert and other information the host may have available on expected upcoming usage of the app that triggered the notification, the host 820 determines a response at step 1005, which it then sent to the controller 802 at step 1007 (where it is received at step 915), indicating whether or not the app should be relocated to another memory section. Depending on the embodiment, the host 820 can instruct the controller 802 to move both the app's code and data payload, just the data payload, or choose between these options. The host may also request a move for one or more associated apps that have or may have high writes due to interaction with the app associated with the alert at step 1003. The flow then moves on to step 1009.

In some embodiments, in addition to the monitoring of step 1003 related to the dynamic relocation of apps stored on the memory system 800, at step 1009 the host 820 can also concurrently monitor the memory system 800 for the dynamic partition of the memory sections of memory device 804. At step 1009, the host 820 is monitoring the memory device for a notification of an EOL imbalance between memory sections, corresponding to the notification of step 923 of FIG. 11. If no such alert is received, the flow loops back to step 1003 for continued monitoring of the memory system 800. If an EOL imbalance alert is received at step 1009, at step 1011 the host makes a determination of whether to reconfigure the memory system 800 and at step 1013 informs the controller 802 (where it is received at step 925), before looping back to step 1003.

The above discussion was in the context of the memory system 800 having a high endurance SLC section 813 and a high density, lower endurance MLC section 811, but the ideas described can be applied more generally. For example, the memory device may have more than two areas or sections of differing endurance or other properties between which apps can be migrated by the host 820 in response to the controller 802 monitoring app usage. In some embodiments, whether a memory section is of higher or lower endurance may not be based on the number of states a memory cell is configured to store, but on other properties, such memory cell size or other features that can affect endurance.

The discussion was mainly discussed for an embodiment where the memory device was a single die, but the memory system will frequently have many die, where each can be sub-divided in this way or where the different memory sections are spread across different die. For example, in an SSD system, some die may be just SLC memory and others just MLC memory. Also, although the sub-division of the memory described is based on the relative endurance of the memory sections, these techniques can similarly be applied to other properties that may differentiate different memory sections. For example, the memory may have areas or sections of different performance levels (such as read or write speeds) and the controller can monitor app use and issue host alerts based on the performance needs of the apps. For any of these embodiments, by dynamically optimizing the location of apps based on their actual usage of memory, the overall lifetime of the memory device can be extended, and the risk of a "rouge app" destroying the memory can be significantly reduced.

One embodiment includes a non-volatile memory apparatus comprising a non-volatile memory and one or more control circuits. The non-volatile memory has a first section and a second section, the second section configured to have a higher endurance level that the first section. The one or more control circuits are configured to receive an application from a host, the application including code for executing the application and data used by the application and store the application in the first section of the non-volatile memory. The one or more control circuits are further configured to monitor a frequency of rewriting of the data used by application and, in response to the frequency of rewriting of the data used by the application exceeding a first value, send a notification to the host. The one or more control circuits are also configured to, in response to a reply from the host requesting that the data used by the application be transferred from the first section of the non-volatile memory to the second section of the non-volatile memory, transfer storage of the data used by the application from the first section of the non-volatile memory to the second section of the non-volatile memory.

One embodiment includes a method that includes storing an application in a first section of a non-volatile memory system. The first section is one of a section of high endurance memory cells or a section of high density memory cells of which the non-volatile memory system is comprised. The application includes code for executing the application and a data payload of the application. The method also includes monitoring a frequency of rewriting of the first section caused by the application, and, in response to a comparison of the frequency of rewriting to a first threshold, issuing by the non-volatile memory system of an alert to a host. The method further includes receiving from the host a reply to the alert instructing the non-volatile memory system to relocate the data payload from the first section of the non-volatile memory system to a second section of the non-volatile memory system, and, in response to the reply, relocating the data payload of the application to the second section of the non-volatile memory system.

Still another embodiment includes a non-volatile memory system, comprising a plurality of non-volatile memory die and a controller. The non-volatile memory die include a section of high endurance memory cells and a section of high density memory cells. The controller is configured to manage storage of data from a host on plurality of the non-volatile memory die, which includes: monitoring memory usage of a first of the sections of the memory cells by an application stored in the first section; issuing a first alert to the host in response to a comparison of the memory usage of the first section by the application to a first value; and relocating the application from the first section to a second of the sections of memory cells in response to a reply from the host to the alert.

One embodiment includes a non-volatile memory apparatus comprising a non-volatile memory having a high endurance section and a high data density section. The non-volatile memory apparatus also includes means for storing an application received from a host in one of either the high endurance section or the high data density section of the non-volatile memory, the application comprising code and a corresponding data payload. The non-volatile memory apparatus further includes means for monitoring a rate of rewriting of the data payload that is generated by the application. The non-volatile memory apparatus also includes means for notifying the host in response to the rate of rewriting of the data payload generated by the application exceeding a threshold and, means for relocating, in response to a reply from the host, the data payload from said one of either the high endurance section or the high data density section to the other of either the high endurance section or the high data density section.

In one embodiment, the means for storing an application can include the memory structure described with respect to structure 326 of FIG. 5 and illustrated with respect to FIGS. 7 and 10, including the read/write circuits 328 and decoding circuits 324 and 332, along with the on-die control circuitry 310 and controller 102. The means for monitoring the rate of data writing can be included in the controller 102, as described in more detail with respect to FIGS. 2 and 3, including MML 158 and other controller elements, and also the on-die control circuits 310. The means for notifying the host and relocating the application can also include the controller 102, as described in more detail with respect to FIGS. 2 and 3, including MML 158 and other controller elements, and also the on-die control circuits 310. Other software or hardware that are part of a memory controller can also be used.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a non-volatile memory having a first section and a second section, wherein the second section is configured to have a higher endurance level than the first section; and
   one or more control circuits connected to the non-volatile memory, wherein the one or more control circuits are configured to:
   receive an application from a host, the application including code for executing the application and data used by the application, and a range of logical addresses corresponding to the code for executing the application and data used by the application;
   store the application in the first section of the non-volatile memory;
   monitor a frequency of rewriting of the whole of the range of logical addresses corresponding to the code for executing the application and the data used by the application;
   in response to the frequency of rewriting of the whole of the range of logical addresses corresponding to the code for executing the application and the data used by the application exceeding a first value, send a first notification to the host; and
   in response to receiving a reply to the first notification from the host requesting that the data used by the application be transferred from the first section of the non-volatile memory to the second section of the non-volatile memory, transfer storage of the whole of the range of logical addresses corresponding to data used by the application from the first section of the non-volatile memory to the second section of the non-volatile memory.

2. The apparatus of claim 1, wherein the one or more control circuits are further configured to:
   subsequent to transferring storage of the data used by the application to the second section of the non-volatile memory, monitor the frequency of rewriting of the data used by the application;
   in response to the frequency of rewriting of the data used by the application being lower than a second value, send a notification to the host; and
   in response to a reply from the host requesting that the data used by the application be transferred from the second section of the non-volatile memory to the first section of the non-volatile memory, transfer storage of the data used by the application from the second section of the non-volatile memory to the first section of the non-volatile memory.

3. The apparatus of claim 1, wherein, when the one or more control circuits receive the application from the host, the one or more control circuits also receive a request from the host that specifies that the application is to be stored in the first section.

4. The apparatus of claim 1, wherein the one or more control circuits are further configured to reconfigure the memory sections to reassign a portion of one of the first section or the second section to the other one of the first section or the second section.

5. The apparatus of claim 1, wherein the one or more control circuits are further configured to transfer storage of the code for executing the application from the first section of the non-volatile memory to the second section of the non-volatile memory in response to the reply from the host further requesting that the code for executing the application be transferred.

6. The apparatus of claim 1, wherein the one or more control circuits are further configured to transfer storage of data used by an associated application from the first section of the non-volatile memory to the second section of the non-volatile memory in response to the reply from the host further requesting that the data used by the associated application be transferred.

7. The apparatus of claim 1, wherein:
   the first section comprises multi-level memory cells; and
   the second section comprises single level memory cells.

8. The apparatus of claim 1, wherein the one or more control circuits are further configured to:
   monitor a frequency of rewriting of individual logical block addresses of the range of logical addresses corresponding to the code for executing the application and the data used by the application;

in response to the frequency of rewriting of one or more of the individual logical addresses of the range of logical addresses exceeding an individual logical block address threshold, send a second notification to the host; and in response to receiving a reply to the second notification from the host requesting that the one or more of the individual logical addresses of the range of logical addresses exceeding the individual logical block address threshold be transferred from the first section of the non-volatile memory to the second section of the non-volatile memory, transfer storage of the one or more of the individual logical addresses of the range of logical addresses exceeding the individual logical block address threshold to the second section of the non-volatile memory.

9. A method, comprising:

storing an application in a range of logical addresses in a first section of a non-volatile memory system, the first section being one of a section of high endurance memory cells or a section of high density memory cells of which the non-volatile memory system is comprised, and where the application includes code for executing the application and a data payload of the application;

monitoring a frequency of rewriting of the whole of the range of logical addresses corresponding to the code for executing the application and the data payload caused by the application;

in response to a comparison of the frequency of rewriting of the whole of the range of logical addresses corresponding to the code for executing the application and the data payload to a first threshold, issuing by the non-volatile memory system a first alert to a host;

receiving from the host a reply to the first alert instructing the non-volatile memory system to relocate the data payload from the first section of the non-volatile memory system to a second section of the non-volatile memory system; and in response to the reply to the first alert, relocating the whole of the range of logical addresses corresponding to the data payload of the application to the second section of the non-volatile memory system.

10. The method of claim 9, further comprising:

prior to monitoring the frequency of rewriting the first section, receiving at the non-volatile memory system from the host the application and a specification of the range of logical addresses in the first section of the non-volatile memory system for storing of the application, wherein the storing the application in the first section of the non-volatile memory system is in response to the specification.

11. The method of claim 9, further comprising:

subsequent to relocating the data payload to the second section, monitoring a frequency rewriting of the second section caused by the application;

in response to a comparison of the frequency rewriting to a second threshold, issuing a further alert to the host by the non-volatile memory system;

in response to the further alert, receiving a reply at the non-volatile memory system from the host to relocate the data payload from the second section of the non-volatile memory system to the first section of the non-volatile memory system; and relocating the data payload from the second section to the first section of the non-volatile memory system.

12. The method of claim 9, further comprising:

in response to the reply, relocating the code for executing the application to the second section of the non-volatile memory system.

13. The method of claim 9, further comprising:

monitoring a rate of aging for the section of high endurance memory cells;

monitoring a rate of aging for the section of high density memory cells; and in response to an imbalance between the rate of aging for the section of high endurance memory cells and the rate of aging for the section of high density memory cells, reassigning memory cells from one of the section of high endurance memory cells or the section of high density memory cells to the other of the section of high endurance memory cells or the section of high density memory cells.

14. The method of claim 13, wherein the reassigning is performed in response to a host request.

15. The method of claim 9, further comprising:

monitoring a frequency of rewriting of individual logical block addresses of the range of logical addresses corresponding to the code for executing the application and the data payload;

in response to the frequency of rewriting of one or more of the individual logical addresses of the range of logical addresses exceeding an individual logical block address threshold, issuing a second alert to the host;

receiving from the host a reply to the second alert instructing the non-volatile memory system to relocate the data payload from the first section of the non-volatile memory system to a second section of the non-volatile memory system; and in response to the reply to the second alert, relocating the whole of the range of logical addresses corresponding to the data payload of the application to the second section of the non-volatile memory system.

16. An apparatus, comprising:

a non-volatile memory having a first section and a second section, wherein the second section is configured to have a higher endurance level than the first section; and means for receiving an application from a host, the application including code for executing the application and data used by the application, and a range of logical block addresses corresponding to the code for executing the application and the data used by the application;

means for storing the application in the first section of the non-volatile memory;

means for monitoring a frequency of rewriting of individual logical block addresses of the range of logical block addresses corresponding to the code for executing the application and the data used by the application;

means for sending a first notification to the host in response to the frequency of rewriting of the individual logical block addresses of the range of logical block addresses corresponding to the code for executing the application and the data used by the application exceeding a first value; and means for transferring storage of the whole of the range of logical block addresses corresponding to data used by the application from the first section of the non-volatile memory to the second section of the non-volatile memory in response to receiving a reply to the first notification from the host requesting that the data used by the application be transferred from the first section of the non-volatile memory to the second section of the non-volatile memory.

17. The apparatus of claim 16, wherein, when the means for receiving the application receives the application from the host, the means for receiving the application also receives a request from the host that specifies that the application is to be stored in the first section.

18. The apparatus of claim 16, further comprising:
 means for reconfiguring the memory sections to reassign a portion of one of the first section or the second section to the other one of the first section or the second section.

19. The apparatus of claim 16, further comprising:
 means for transferring storage of the code for executing the application from the first section of the non-volatile memory to the second section of the non-volatile memory in response to the reply from the host further requesting that the code for executing the application be transferred.

20. The apparatus of claim 16, further comprising:
 means for transferring storage of data used by an associated application from the first section of the non-volatile memory to the second section of the non-volatile memory in response to the reply from the host further requesting that the data used by the associated application be transferred.

\* \* \* \* \*